United States Patent [19]

Mori et al.

[11] 4,375,644
[45] Mar. 1, 1983

[54] PHOTOELECTRIC ELEMENT, PICTURE-READING DEVICE INCLUDING THE SAME, AND PROCESS FOR PRODUCTION THEREOF

[75] Inventors: Kouji Mori, Yokohama; Hideo Segawa, Ooji; Kouichi Sakurai; Masanori Itagaki, both of Kawasaki, all of Japan

[73] Assignee: Ricoh Co., Ltd., Tokyo, Japan

[21] Appl. No.: 209,138

[22] Filed: Nov. 21, 1980

[30] Foreign Application Priority Data

Nov. 30, 1979 [JP] Japan .............................. 54-155267
Dec. 3, 1979 [JP] Japan .............................. 54-156524
Dec. 19, 1979 [JP] Japan .............................. 54-165162
Dec. 24, 1979 [JP] Japan .............................. 54-166796

[51] Int. Cl.³ ........................................ H01L 27/14
[52] U.S. Cl. .................................... 357/30; 357/2; 357/16; 357/61
[58] Field of Search ..................... 357/30, 16, 61, 2

[56] References Cited

U.S. PATENT DOCUMENTS 4,207,119  6/1980  Tyan .............................. 357/16 X
4,287,383  9/1981  Peterson ........................ 357/30 X Primary Examiner—Martin H. Edlow
Attorney, Agent, or Firm—Oblon, Fisher, Spivak, McClelland & Maier

[57] ABSTRACT

A photoelectric device comprises a substrate, a counter electrode, and a photoelectric element interposed therebetween in deposited state and comprising, in successively deposited state, a transparent electroconductive film, a CdS film, a CdTe film, and an $As_2Se_3$ film. This device is produced by successively depositing the films while the substrate is maintained at respective specific temperatures, the CdS film and the CdTe film being respectively heat treated at respective specific temperatures and in specific atmospheres after deposition.

17 Claims, 8 Drawing Figures

A: DARK CURRENT
B: PHOTOELECTRIC CURRENT

I-λ CHARACTERISTIC

SUBSTRATE TEMPERATURE:
ROOM TEMPERATURE

SUBSTRATE TEMPERATURE: 200°C

SUBSTRATE TEMPERATURE: 250°C

SUBSTRATE TEMPERATURE: 300°C

NO HEAT TREATMENT

HEAT TREATMENT AT 500°C

HEAT TREATMENT AT 600°C

HEAT TREATMENT AT 700°C

HEAT TREATMENT AT 700°C

HEAT TREATMENT AT 600°C

HEAT TREATMENT AT 500°C

NO HEAT TREATMENT

PHOTOELECTRIC ELEMENT, PICTURE-READING DEVICE INCLUDING THE SAME, AND PROCESS FOR PRODUCTION THEREOF

BACKGROUND OF THE INVENTION

This invention relates to photoelectric element and device used for converting light energy into electric signals in the picture-reading apparatus such as a facsimile apparatus, more particularly, the invention relates to an improved photoelectric element which has a small dark current when in a reverse-bias state and, moreover, a high photoresponse rate, and which is readily and economically produced and can be produced in long lengths. The invention also relates to a device including the photoelectric element according to the invention and further to a process for producing the photoelectric element.

Photoelectric elements which have small dark currents in the state of reverse bias and, moreover, have high photoresponse rates are being widely used in picture-reading apparatuses such as those of facsimiles, and much research is being carried out with the aim of improving the performances of these photoelectric elements.

As photoelectric elements of this character, silicon-based photoelectric elements such as charge-coupled devices, metal-oxide semiconductors, and the like have heretofore been widely used. In the production of a silicon-based photoelectric element of such a character, a high degree of precision and fabrication technique is required.

More specifically, in the preparation of a silicon crystal, if there should be any ununiformity in the temperature distribution during its growth, the growth rate will fluctuate slightly, and segregation of the added active impurities will occur. As a consequence, ununiformity of the resistances in the diametrical direction and the axial direction will be produced. Furthermore, also in the formation of an oxide film for functioning as an insulating film in this element, it is necessary to rigidly regulate the temperature and the atmosphere, and, in the case where ions such as Na+ are contained as an impurity, moreover, there is the undesirable possibility of the characteristics of the formed product becoming unstable. In addition, in the etching of a substrate with an oxide film or the like as a mask, also, the etching rate varies with variations conditions such as the composition, temperature, and quantity of the etching solution and the rate of agitation, whereby it is necessary to strictly control these conditions.

Thus, a silicon-based photoelectric element is easily affected by the production process. As a consequence, deviations arise in the characteristics of the element, and the yield of the product is lowered, whereby the production cost becomes disadvantageously high.

Still another problem associated with silicon-based photoelectric elements is that, in the present state of the art of production thereof, it is difficult to fabricate elements of long lengths or large areas. For this reason, it becomes necessary to reduce the size of the original picture by means of lenses, and an optical system occupying much space becomes necessary, whereby it is difficult to reduce the size of the apparatus.

SUMMARY OF THE INVENTION

It is an object of this invention to overcome the above described problems encountered in the prior art by providing a photoelectric element which has a small dark current when in a reverse-bias state and, moreover, a high photoresponse rate, and which is readily and economically produced and can be produced in long lengths.

Other objects of this invention are to provide a photoelectric device including the photoelectric element of this invention and to provide a process for producing a photoelectric element according to this invention.

According to this invention in one aspect thereof, briefly summarized, there is provided a photoelectric element characterized by a deposited structure of (I) a transparent electroconductive film, (II) a first film of II-VI compound having a relatively large band gap, (III) a second film of II-VI compound film having a band gap smaller than that of the first film and (IV) an amorphous chalocogenide film, which films (I) through (IV) are successively deposited in the sequence named.

According to this invention in another aspect thereof, there is provided a photoelectric device comprising a substrate, a counter electrode, and a photoelectric element according to this invention interposed in deposited state between the counter electrode and the substrate.

According to this invention in a further aspect thereof, there is provided a process for producing a photoelectric device which comprises: depositing a transparent electroconductive film onto a substrate; depositing a CdS film onto the transparent electroconductive film while the temperature of the substrate is maintained at 200° to 350° C.; thereafter heat treating the CdS film at 400° to 700° C. in an oxygen-containing atmosphere; depositing a CdTe film onto the CdS film while the temperature of the substrate is maintained at 200° to 350° C.; thereafter heat treating this CdTe film at 100° to 700° C. in an oxygen-containing atmosphere and/or an inert gas; depositing an $As_xSe_{1-x}$ film onto the CdTe film while the substrate temperature is maintained at or below 200° C., and providing a counter electrode onto the $As_xSe_{1-x}$ film.

The nature, utility, and further features of this invention will be more clearly apparent from the following detailed description when read in conjunction with the accompanying illustrations, briefly described below.

DETAILED DESCRIPTION OF THE INVENTION

Figure 1:
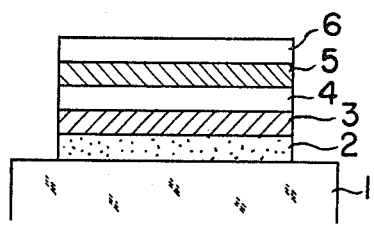
FIG. 1 is a schematic sectional view, taken along a plane perpendicular to deposited films, showing one example of a photoelectric device including a photoelectric element according to this invention.

For the substrate 1 in the photoelectric element and device of this invention, substances can be selected from a wide range of materials such as soda-lime glass, quartz glass, borosilicate glass, and various plastics.

Onto this substrate 1, a transparent, electroconductive film 2 of a substance such as indium oxide ($In_2O_3$), tin oxide ($SnO_2$), or indium-tin oxide is deposited with a thickness of 100 Å to 1 μm by spraying, sputtering, vacuum vapor deposition, or some other appropriate methods.

Examples of the film 3 of II-VI compound having a relatively large band gap to be deposited onto this transparent, electroconductive film 2 are a CdS film ($Eg \approx 2.6$ ev), ZnS film ($Eg \approx 3.9$ ev), and ZnSe film ($Eg \approx 2.8$ ev). Of these, a CdS film is particularly preferred, and, in the following description, the case wherein a CdS film is used as a film of a compound having a relatively large band gap will be considered.

The term "a film of II-VI compound" as herein used means a film of a compound consisting of two elements, one being selected from the Group II elements and the other being selected from the Group VI elements.

This CdS film 3 is deposited with a thickness of 1 to 10 μm, preferably 1 to 3 μm by a method such as sputtering or vacuum vapor deposition on the transparent, electroconductive film 2. It is desirable that the temperature of the substrate during this deposition be maintained at 200° to 350° C., preferably 250° to 300° C. The SEM photographic images of CdS in the cases where CdS films are sputtered as the substrate temperatures are maintained at room temperature (25° C.), 200° C., 250° C., and 300° C. are respectively shown in FIGS. 6a through 6d.

Since there are differences in the directivity of the crystal growth rate in the case of this CdS film 3, the C axis ordinarily grows on the substrate, and this CdS film is formed as an aggregate of fine crystalline grains. The size of these crystalline grains is depending upon the heat-treatment conditions. More specifically, as indicated in FIGS. 6a through 6d, in the case where the substrate temperature is lower than 200° C., the deposited CdS grains become excessively small, while in the case where this temperature is 350° C. or higher, the CdS grains become coarse. The grain size of these crystals has an influence on the dark resistance, which increases with increasing crystal grains size. Thus, the optimum substrate temperature is from 250° C. to 350° C.

As mentioned hereinbefore, the CdS film 3 sputtered on the substrate is heat treated in the natural atmosphere or an atmosphere containing oxygen at a temperature of 400° to 700° C., preferably 500° to 600° C. In this heat treatment, rapid heating or rapid cooling of the CdS film is not desirable, and it is necessary that the temperature rise rates and the temperature fall rates of this film be within a range of 2° to 20° C. per minute. FIGS. 7a through 7d show SEM photographic images of CdS films respectively in cases where CdS films sputtered at a substrate temperature of 250° C. are heat treated at respectively different temperatures.

By such a heat treatment as described above, the CdS film 3 in an oxygen-containing atmosphere, the outer surface layer of the CdS film is partly oxidized, and a CdS partially-oxidized film is formed. If, in this process, a heat-treatment temperature of about 700° C. is used, the oxidation of the CdS film will proceed to completion, and a large quantity of CdO will be formed. This will have a undesirable effect on the photoelectric characteristic of the photoelectric element and is therefore not desirable. On the other hand, if the heat-treatment temperature is below 400° C., the CdS partly-oxidized film not be amply formed, which result is also not desirable.

The term "CdS partially-oxidized film" as herein used means a film obtained by partly oxidizing the outer surface layer of a CdS film by heat treating the CdS film in an oxygen-containing atmosphere (inclusive of the natural atmosphere) at a temperature of 300° to 700° C., preferably 500° to 600° C. and does not include a CdO film obtained by completely oxidizing the CdS film. This CdS partially-oxidized film can be represented as $CdSO_x$ and may be presumed to be $CdSO_4$, $CdSO_3$, etc. Thus, "partially" means the degree of oxidation and not locality or position.

Figure 8A:
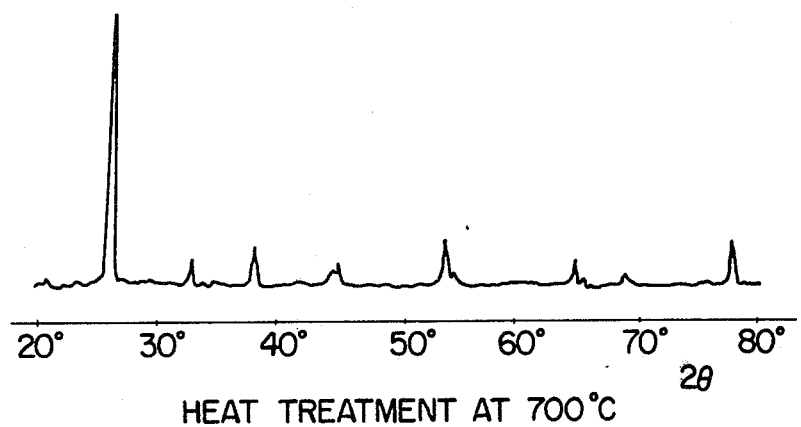
FIGS. 8a through 8d are X-ray diffraction charts of CdS partially-oxidized films resulting from heat treatment at respectively different temperatures and from no heat treatment.
Figure 8B:
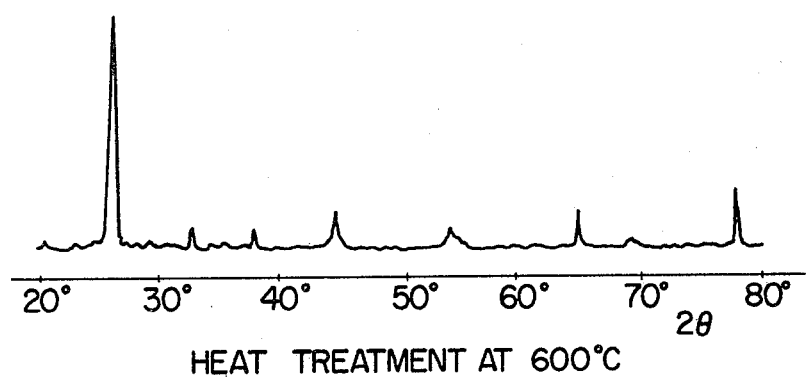
Figure 8C:
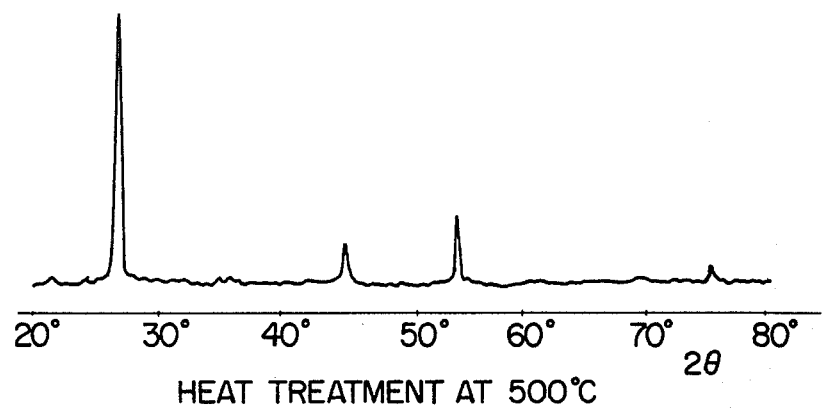
Figure 8D:
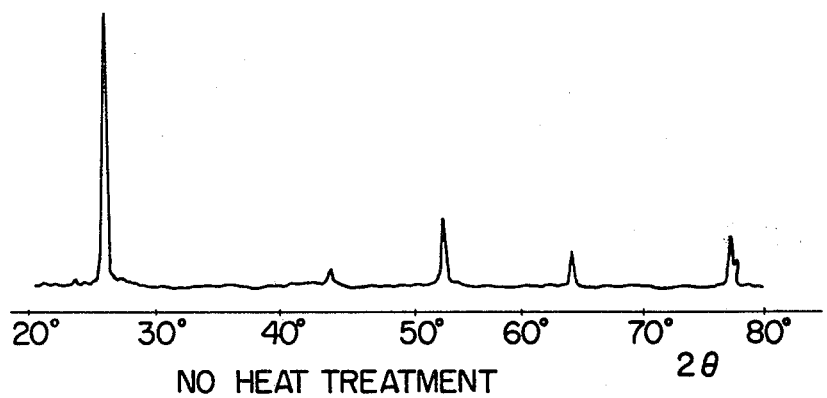

X-ray diffraction charts of CdS partially-oxidized films formed by heat treating Cds films in an oxygen-containing atmosphere at different temperatures and not heat treating a CdS film are respectively shown in FIGS. 8a through 8d, which respectively correspond to heat-treatment temperatures of 700° C., 600° C., and 500° C., and to the case wherein no heat treatment was carried out. As indicated in FIG. 8a, when the CdS film is heat treated at 700° C. or higher temperature, the peaks of CdO increase. Peaks which may be considered to be based on CdO are recognizable at 2θ angles of 33°, 38.5°, 53.5°, and 69° and are based on (1.1.1), (2.0.0), (2.2.0), and (2.2.2) planes, respectively. Furthermore, peaks other than those of CdS and CdO appearing in FIGS. 8b and 8c may be considered to be based on a partially oxidized CdS film, and these may be presumed to be $CdSO_x$, for example, $CdSO_4$ and $CdSO_3$.

A photoelectric element containing a CdS partially-oxidized film formed by heat treating a CdS film in an oxygen-containing atmosphere in this manner is advantageously superior to a photoelectric element fabricated without any heat treatment of the CdS film in having a higher sensitivity to light, a smaller dark current in a reverse-bias state, greater stability with respect to variations with the elapse of time, and higher photoresponse rate.

Next, the second film of II-VI compound to be deposited onto the CdS film 3 and having a band gap smaller than that of the afore-mentioned first film of II-VI compound will be considered. For this second film 4, a CdTe film ($Eg \approx 1.6$ ev) and a CdSe film ($Eg \approx 1.8$ ev) can be used. Of these, a CdTe film is particularly preferable, and the following description is set forth with respect to the case wherein a CdTe film is used for the second film of II-VI compound having a smaller band gap.

This CdTe film 4 is deposited onto the CdS film 3 with a thickness of 0.2 to 5 μm, preferably from 0.5 to 2 μm, by a process such as sputtering or vacuum vapor deposition. It is desirable to maintain the substrate temperature during this process at 200° to 350° C., preferably 250° to 300° C.

The CdTe film thus deposited onto the CdS film is heat treated in an oxygen-containing atmosphere at 100° to 700° C., preferably 300° to 600° C. For this oxygen-containing atmosphere, a gas mixture of an inert gas such as argon, neon, helium, or nitrogen and oxygen is desirable, but an atmosphere of air may be used. A mixture of argon and oxygen is particularly preferable. Specifically, the above mentioned heat treatment is carried out by passing the mixture of argon and oxygen through a heat-treatment furnace, during which suitable flow rates of the argon and the oxygen are 100 cc/min.cm$^2$ and 4 cc/min.cm$^2$, respectively. In the case where the heat-treatment temperature is selected at 500° C., for example, the heat-treatment time is desirably of the order of approximately 10 minutes.

It is desirable that the CdTe film deposited in the above described manner onto the CdS film heat treated in an oxygen-containing atmosphere be further subjected to a heat treatment in an atmosphere of an inert gas at 100° to 700° C., preferably 300° to 600° C. For this inert gas, argon, neon, helium, or nitrogen is used.

By such a heat treatment of the CdTe film deposited onto the CdS film, the heterojunction at the interface between the CdS film and the CdTe film becomes strong, and the I-V characteristic and the I-λ characteristic as a photoelectric element become excellent.

Next, onto this CdTe film 4, an amorphous chalcogenide film 5 is deposited with a thickness of 0.1 to 1 μm, preferably 0.1 to 0.3 μm by a process such as sputtering or vacuum vapor deposition. It is desirable that the substrate temperature be from room temperature to 200° C. during this process. Examples of suitable amorphous chalcogenide compounds are $As_xSe_{1-x}$ ($0<x<1$) and $As_yS_{1-y}$ ($0<y<1$), of which $As_2Se_3$ is particularly preferable.

Then, on this amorphous chalcogenide film 5, a counter electrode 6 of gold or the like is provided by a process such as sputtering or vacuum vapor deposition, whereupon a photoelectric device including a photoelectric element of this invention as shown in FIG. 1 is obtained.

Figure 2A:
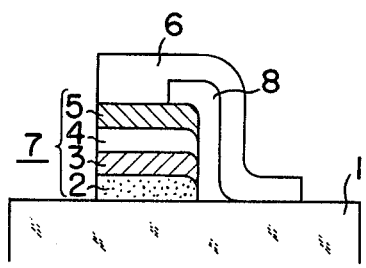

A photoelectric device constituting another specific example of this invention is shown in FIG. 2a. In this device, there is provided, on a light-transmissive substrate 1, a deposited structure 7 comprising in deposited state a transparent electroconductive film 2 disposed onto the substrate 1, the first film of II-VI compound 3 having a relatively large band gap and disposed on the film 2, the second film of II-VI compound 4 having a band gap smaller than that of the film 3 and disposed on the film 3, and an amorphous chalcogenide film 5 disposed on the film 4.

Figure 2B:
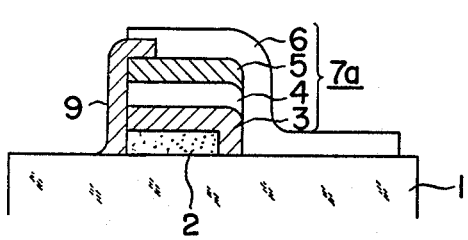

From a part on the top surface of the deposited structure 7, over one side part thereof, and to the substrate 1, there is formed an insulating layer 8 to a thickness of 0.01 to 0.5 μm by a process such as sputtering or vacuum vapor deposition. For this insulating layer 8, an inorganic substance such as $SiO_2$, $Al_2O_3$, $K_2O$, or $TiO_2$ or an insulating organic substance is used. This insulating layer 8 is thus provided to form an insulation between the transparent electroconductive film 2 and a counter electrode 6 contacting the top surface of the deposited structure 7 and disposed outside of the insulating layer 8 to the substrate 1. Therefore, this insulating layer 8 may be provided on only one side part of the transparent electroconductive film 2. By covering the parts of the deposited structure 7a exposed to the atmosphere with an insulative protective film 9, as indicated in FIG. 2b, deterioration of the photoelectric element can be prevented.

Figure 3:
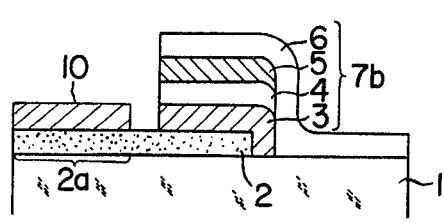
FIGS. 2a, 2b, and 3 are views similar to FIG. 1 respectively showing photoelectric devices constituting other specific examples of the invention.

A photoelectric device including a photoelectric element of this invention is illustrated in FIG. 3. In this example, a deposited structure 7b, comprising the first film of II-VI compound 3 having a relatively large band gap, the second film of II-VI compound 4 having a smaller band gap, an amorphous chalcogenide film 5, and a counter electrode 6 is provided on only a portion of a transparent electroconductive film 2. On the remaining portion 2a of this film 2, a metal electrode 10 is disposed. This electrode 10 is provided for the purpose of preventing wasteful consumption of electric power arising from the high resistance value of the transparent electroconductive film 2.

Figure 4:
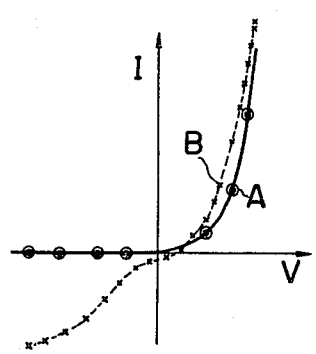
FIG. 4 is a graph indicating the current-voltage characteristic of a photoelectric element of the invention.
Figure 5:
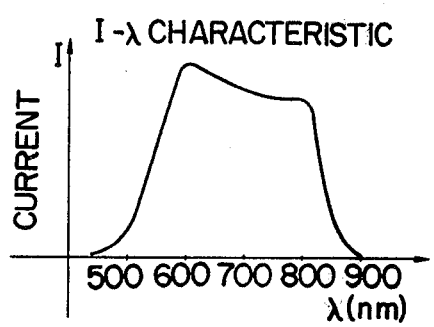
FIG. 5 is a graph indicating the current-wave length characteristic of the same photoelectric element.
Figure 6A:
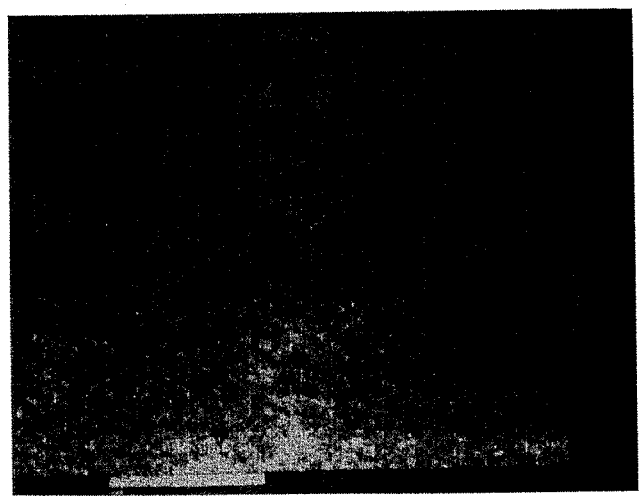
FIGS. 6a through 6d are photographs taken through a scanning electron microscope (SEM) of CdS films respectively formed by sputtering at different substrate temperatures.
Figure 6B:
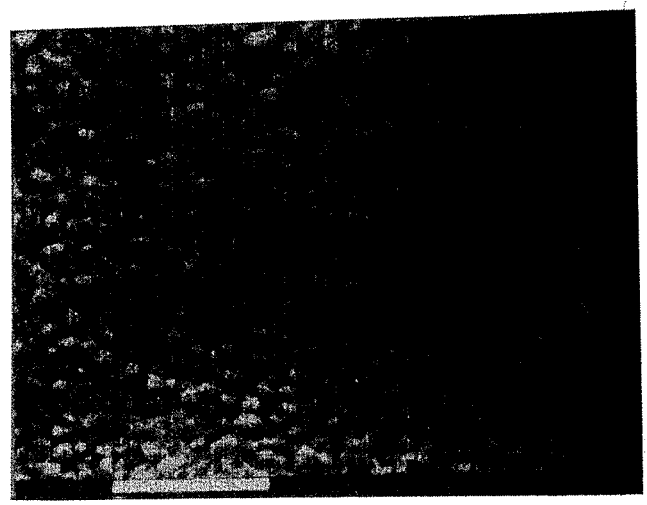
Figure 6C:
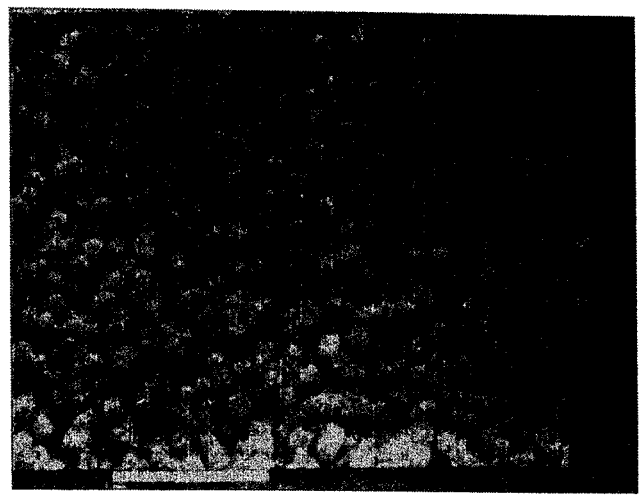
Figure 6D:
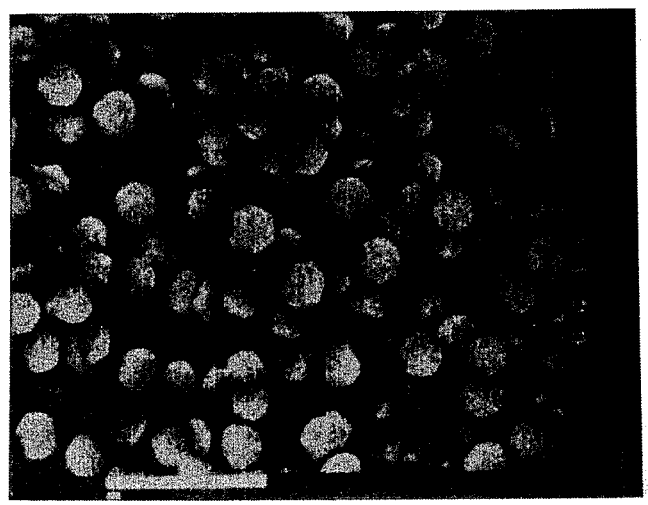
Figure 7A:
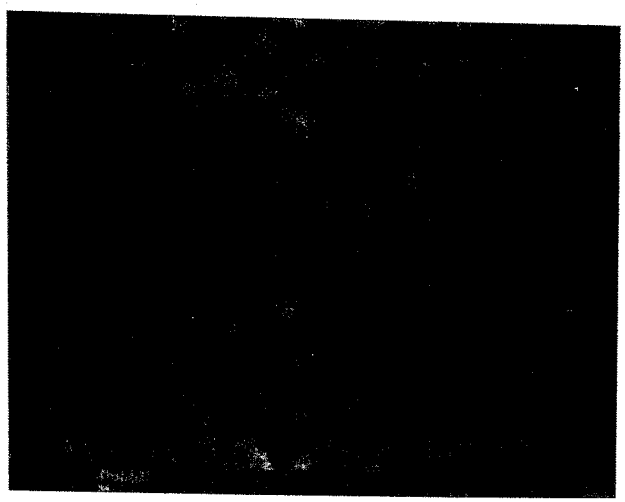
FIGS. 7a through 7d are photographs taken through a SEM of a CdS film not heat treated and of CdS films respectively heat treated at different temperatures.
Figure 7B:
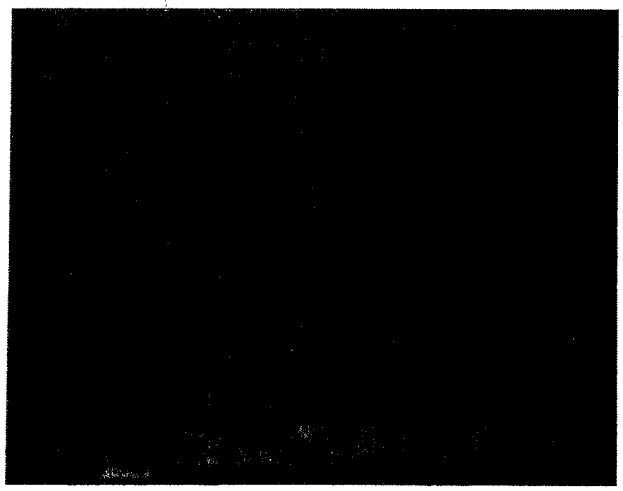
Figure 7C:
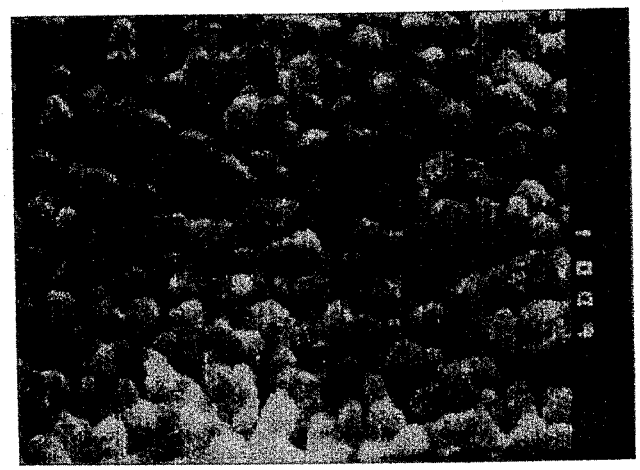
Figure 7D:

The I-V characteristic of a photoelectric device of this invention comprising, in deposited state as described hereinbefore, a photoelectric element comprising a transparent electroconductive film 2 ($In_2O_3$), a CdS film 3, a CdTe film 4, and a $As_2Se_3$ film 5 and a counter electrode 6, is indicated in FIG. 4. The I-λ characteristic of this device is indicated in FIG. 5. As indicated in FIG. 4, the dark current of the photoelectric element according to this invention is amply small, and under illumination, moreover, a good photoelectric current is obtained. Furthermore, as indicated in FIG. 5, the photoelectric element according to this invention has a good spectral response.

Since the photoelectric element and picture-reading device of this invention are formed by a depositing process, they have an advantage in that they can be fabricated as structures of long lengths and large areas and can be used in facsimile apparatuses and digital copyers.

What is claimed is:

1. A photoelectric element comprising: (I) a transparent electroconductive film; (II) a first film of II-VI compound having a relatively large band gap; (III) a second film of II-VI compound having a band gap smaller than that of the first film; and (IV) an amorphous chalcogenide film, said films (I) through (IV) being successively deposited in the order named.

2. A photoelectric element as claimed in claim 1 in which the transparent electroconductive film is a film of a substance selected from the group consisting of indium oxides, tin oxides and indium tin oxides.

3. A photoelectric element as claimed in claim 1 in which the first film (II) of II-VI compound having a relatively large band gap is a member selected from the group consisting of a CdS film, a ZnS film, a ZnSe film, a ZnO film and a ZnTe film.

4. A photoelectric element as claimed in claim 3 in which the first film (II) of II-VI compound having a relatively large band gap is a CdS film.

5. A photoelectric element as claimed in claim 4 in which the thickness of the CdS film (II) is 1 to 10 μm.

6. A photoelectric element as claimed in claim 4 in which the thickness of the CdS film is 1 to 3 μm.

7. A photoelectric element as claimed in claim 1 in which the second film (III) of II-VI compound having the band gap smaller than that of the first film is a member selected from the group consisting of a CdTe film and a CdSe film.

8. A photoelectric element as claimed in claim 7 in which the second film (III) of II-VI compound having the band gap smaller than that of the first film is a CdTe film.

9. A photoelectric element as claimed in claim 7 in which the thickness of the CdTe film (III) is 0.2 to 5 μm.

10. A photoelectric element as claimed in claim 7 in which the thickness of the CdTe film (III) is 0.5 to 2 μm.

11. A photoelectric element as claimed in claim 1 in which the amorphous chalcogenide film is a member selected from the group consisting of an $As_xSe_{1-x}$ ($0<x<1$) film and an $As_yS_{1-y}$ ($0<y<1$) film.

12. A photoelectric element as claimed in claim 11 in which the amorphous chalcogenide film is an $As_2Se_3$ film.

13. A photoelectric element as claimed in claim 11 in which the thickness of the $As_2Se_3$ film (IV) is 0.1 to 1 μm.

14. A photoelectric element as claimed in claim 1 which comprises (I) the transparent electroconductive film, (II) a CdS film, (III) a CdTe film, and (IV) an $As_2Se_3$ film, said films (I) through (IV) being successively deposited in the order named.

15. A photoelectric elements as claimed in claim 14 which further comprises a CdS partially oxidized film formed by heat treating said CdS film in an oxygen-containing atmosphere interposed between the CdS film and the CdTe film.

16. A photoelectric device comprising, in successively deposited state in the order named, a substrate, a photoelectric element as claimed in claim 14, and a counter electrode.

17. A photoelectric device as claimed in claim 16 which further comprises an insulating layer suitably disposed about said counter electrode and said substrate.

* * * * *